United States Patent
Gambino et al.

(10) Patent No.: US 8,409,899 B2
(45) Date of Patent: Apr. 2, 2013

(54) DELAMINATION AND CRACK RESISTANT IMAGE SENSOR STRUCTURES AND METHODS

(75) Inventors: Jeffrey P. Gambino, Westford, VT (US); Mark D. Jaffe, Shelburne, VT (US); Robert K. Leidy, Burlington, VT (US); Charles F. Musante, South Burlington, VT (US); Richard J. Rassel, Essex Junction, VT (US)

(73) Assignee: Intnernational Business Machines Corporation, Armonk, NY (US)

( * ) Notice: Subject to any disclaimer, the term of this patent is extended or adjusted under 35 U.S.C. 154(b) by 63 days.

(21) Appl. No.: 13/025,681

(22) Filed: Feb. 11, 2011

(65) Prior Publication Data
US 2011/0129955 A1   Jun. 2, 2011

Related U.S. Application Data

(62) Division of application No. 12/132,875, filed on Jun. 4, 2008, now Pat. No. 7,928,527.

(51) Int. Cl.
  *H01L 29/72*      (2006.01)
(52) U.S. Cl. .............. 438/48; 438/70; 438/71; 438/72
(58) Field of Classification Search ............ 438/48, 438/70, 71, 72
  See application file for complete search history.

(56) References Cited

U.S. PATENT DOCUMENTS

| | | | |
|---|---|---|---|
| 5,834,829 A | 11/1998 | Dinkel et al. | |
| 6,174,814 B1 | 1/2001 | Cook et al. | |
| 6,617,189 B1 * | 9/2003 | Chen et al. | 438/48 |
| 6,709,954 B1 | 3/2004 | Werking | |
| 6,734,090 B2 | 5/2004 | Agarawala et al. | |
| 6,861,207 B2 | 3/2005 | Hsu et al. | |
| 7,056,807 B2 | 6/2006 | Kellar et al. | |
| 7,109,093 B2 | 9/2006 | Fitzsimmons et al. | |
| 7,129,565 B2 | 10/2006 | Watanabe et al. | |

(Continued)

FOREIGN PATENT DOCUMENTS

| | | |
|---|---|---|
| KR | 2004006748 A | 1/2004 |
| KR | 2004095971 A | 11/2004 |
| KR | 2004095973 A | 11/2004 |

OTHER PUBLICATIONS

Oh, et al., "Enhancement of Wafer Test/Package Yields by Oxide-Capping of Microlens in CMOS Image Sensor", System IC R&D Division, Hyundai Electronics Industries, The Second IEEE Asia Pacific Conference on ASICs/Aug. 28-30, 2000, pp. 259-262 (2000).

*Primary Examiner* — Edward Wojciechowicz

(74) *Attorney, Agent, or Firm* — Scully, Scott, Murphy & Presser, P.C; Anthony J. Canale

(57) ABSTRACT

A plurality of image sensor structures and a plurality of methods for fabricating the plurality of image sensor structures provide for inhibited cracking and delamination of a lens capping layer with respect to a planarizing layer within the plurality of image sensor structures. Particular image sensor structures and related methods include at least one dummy lens layer of different dimensions than active lens layer located over a circuitry portion of a substrate within the particular image sensor structures. Additional particular image sensor structures include at least one of an aperture within the planarizing layer and a sloped endwall of the planarizing layer located over a circuitry portion within the particular image sensor structures.

11 Claims, 12 Drawing Sheets

U.S. PATENT DOCUMENTS

| | | |
|---|---|---|
| 7,163,883 B2 | 1/2007 | Agarwala et al. |
| 2004/0147105 A1 | 7/2004 | Chang et al. |
| 2005/0208692 A1 | 9/2005 | Lee |
| 2006/0043261 A1 | 3/2006 | Matsuda et al. |
| 2007/0187787 A1* | 8/2007 | Ackerson et al. ............. 257/428 |
| 2009/0014760 A1* | 1/2009 | Park .............................. 257/292 |

* cited by examiner

DELAMINATION AND CRACK RESISTANT IMAGE SENSOR STRUCTURES AND METHODS

RELATED APPLICATIONS

This application is a divisional of U.S. application Ser. No. 12/132,875, filed Jun. 4, 2008.

BACKGROUND

1. Field of the Invention

The invention relates generally to image sensor structures. More particularly, the invention relates to image sensor structures with enhanced performance and reliability.

2. Description of the Related Art

Beyond purely electronic microelectronic structures and semiconductor structures such as but not limited to microprocessor structures and memory cell structures, microelectronic structures and semiconductor structures also include optoelectronic structures, such as but not image sensor structures and light emitting diode structures. Image sensor structures are particularly desirable within the context of optoelectronic structures, since image sensor structures find use within various common optoelectronic applications, such as digital cameras.

While image sensor structures are thus desirable within the microelectronic structure and semiconductor structure fabrication art, image sensor structures are nonetheless not entirely without problems. In particular image sensor structures are often fabricated using multiple material layers that may be incompatible, and that may need to conform to both optical and electrical requirements when fabricating an image sensor structure. For that reason, image sensor structures are often susceptible to enhanced cracking, delamination and related failures that may otherwise compromise reliability and functionality of a particular image sensor structure.

Various semiconductor structures having desirable properties, within the context of delamination inhibition, crack inhibition or related quality or reliability considerations, and methods for fabricating those semiconductor structures, are generally known in the semiconductor fabrication art.

Particular disclosures include: (1) Dinkel et al., in U.S. Pat. No. 5,834,829 (which teaches a crack stop structure that includes at least one metallization layer that surrounds an active region within a semiconductor substrate); (2) Cook, in U.S. Pat. No. 6,174,814 (a crack stop structure that channels a crack within a horizontal direction rather than a vertical direction within a laminated dielectric layer stack); (3) Werking, in U.S. Pat. No. 6,709,954 (a scribe seal structure that includes crack stop properties); (4) Agarwala et al., in U.S. Pat. No. 6,734,090 and U.S. Pat. No. 7,163,883 (an edge seal structure that provides crack stop properties with respect to a low dielectric constant dielectric material); (5) Kellar et al., in U.S. Pat. No. 7,056,807 (an edge barrier structure for use within a multiple wafer bonded vertical stack); (6) Fitzsimmons et al. in U.S. Pat. No. 7,109,093 (a crack stop layer that includes a release liner); and (7) Watanabe et al., in U.S. Pat. No. 7,129,565 (a semiconductor structure that includes a crack stop sub-wall portion).

Similarly, and more specifically, various image sensor structures having desirable properties, within the context of delamination inhibition, crack inhibition or related quality or reliability considerations, and methods for fabricating those image sensor structures, are more specifically also known in the image sensor fabrication art.

Particular examples include: (1) Kim, in Korean Patent Publication No. KR 20040095971 and KR 20040095973 (a laminated and offset passivation layer for crack inhibition within a pad region within an image sensor); (2) Park, in Korean Patent Publication Number KR 2004006748 (a CMOS image sensor that includes a dummy edge die region); and (3) Oh et al., in "Enhancement of Wafer Test/Package Yields by Oxide-Capping of Microlens in CMOS Image Sensor," Proceedings of The Second IEEE Asia Pacific Conference on ASICs. Aug. 28-30, 2000, IEEE 2000, 0-7803-6470-8/00 (general methods for fabricating image sensor structures).

Crack inhibition and delamination inhibition within semiconductor structures, and more particularly within image sensor structures, is likely to be of considerable continued importance as semiconductor structure fabrication technology, and in particular image sensor fabrication technology, advances. To that end, desirable are image sensor structures and methods for fabrication thereof, with inhibited delamination, cracking and related quality and reliability failures.

SUMMARY

The invention provides a plurality of image sensor structures, in conjunction with a related plurality of methods for fabricating the plurality of image sensor structures. The particular plurality of image sensor structures in accordance with the invention is intended to: (1) inhibit cracking of a lens capping layer; or (2) inhibit delamination of the lens capping layer from a planarizing layer, where the lens capping layer is located and formed capping exposed portions of a plurality of active lens layers and the planarizing layer upon which is located and formed the plurality of active lens layers, within the image sensor structure.

A particular image sensor structure in accordance with the invention includes a substrate including a photosensitive portion and a circuitry portion. This particular image sensor structure also includes a dielectric isolated metallization stack located upon the substrate. This particular image sensor structure also includes a planarizing layer located over the dielectric isolated metallization stack. This particular image sensor structure also includes a plurality of active lens layers located over the planarizing layer and registered with a plurality of photoactive regions within the photosensitive portion, and at least one dummy lens layer of different dimensions located at least in part over the planarizing layer over the circuitry portion. This particular image sensor structure also includes a lens capping layer passivating exposed portions of the plurality of active lens layers, the at least one dummy lens layer and the planarizing layer.

Another particular image sensor structure in accordance with the invention includes a substrate including a photosensitive portion and a circuitry portion. This other particular image sensor structure also includes a dielectric isolated metallization stack located upon the substrate. This other particular image sensor structure also includes a planarizing layer located over the dielectric isolated metallization stack. This other particular image sensor structure also includes a plurality of active lens layers located over the planarizing layer and registered with a plurality of photosensitive regions within the photosensitive portion. This other particular image sensor structure also includes a lens capping layer passivating exposed portions of the plurality of active lens layers and the planarizing layer. The planarizing layer includes at least one of: (1) an aperture located within the planarizing layer; and (2) a sloped endwall of the planarizing layer, located over the circuitry region.

A particular method for fabricating an image sensor structure in accordance with the invention includes providing a substrate including a photosensitive portion and a circuitry portion. This particular method also includes forming a dielectric isolated metallization stack located upon the substrate. This particular method also includes forming a planarizing layer over the dielectric isolated metallization stack. This particular method also includes forming a plurality of active lens layers located over the planarizing layer and registered with a plurality of photosensitive regions within the photosensitive portion, and forming at least one dummy lens layer of different dimensions at least in part over the planarizing layer and over the circuitry portion. This particular method also includes forming a lens capping layer passivating exposed portions of the plurality of active lens layers, the at least one dummy lens layer and the planarizing layer.

Another particular method for fabricating an image sensor structure in accordance with the invention includes providing a substrate including a photosensitive portion and a circuitry portion. This particular method also includes forming a dielectric isolated metallization stack upon the substrate. This particular method also includes forming a planarizing layer over the dielectric isolated metallization stack. This particular method also includes forming a plurality of active lens layers over the planarizing layer and registered with a plurality of photosensitive regions within the photosensitive portion. This particular method also includes forming a lens capping layer passivating exposed portions of the plurality of active lens layers and the planarizing layer. The planarizing layer includes at least one of: (1) an aperture formed within the planarizing layer; and (2) a sloped endwall of the planarizing layer, over the circuitry portion.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The invention, which includes a particular plurality of image sensor structures with inhibited susceptibility to: (1) lens capping layer cracking; and (2) lens capping layer to planarizing layer delamination, and a related particular plurality of methods for fabricating the plurality of image sensor structures, is understood within the context of the description set forth below. The description set forth below is understood within the context of the drawings described above. Since the drawings are intended for illustrative purposes, the drawings are not necessarily drawn to scale.

Figure 1:
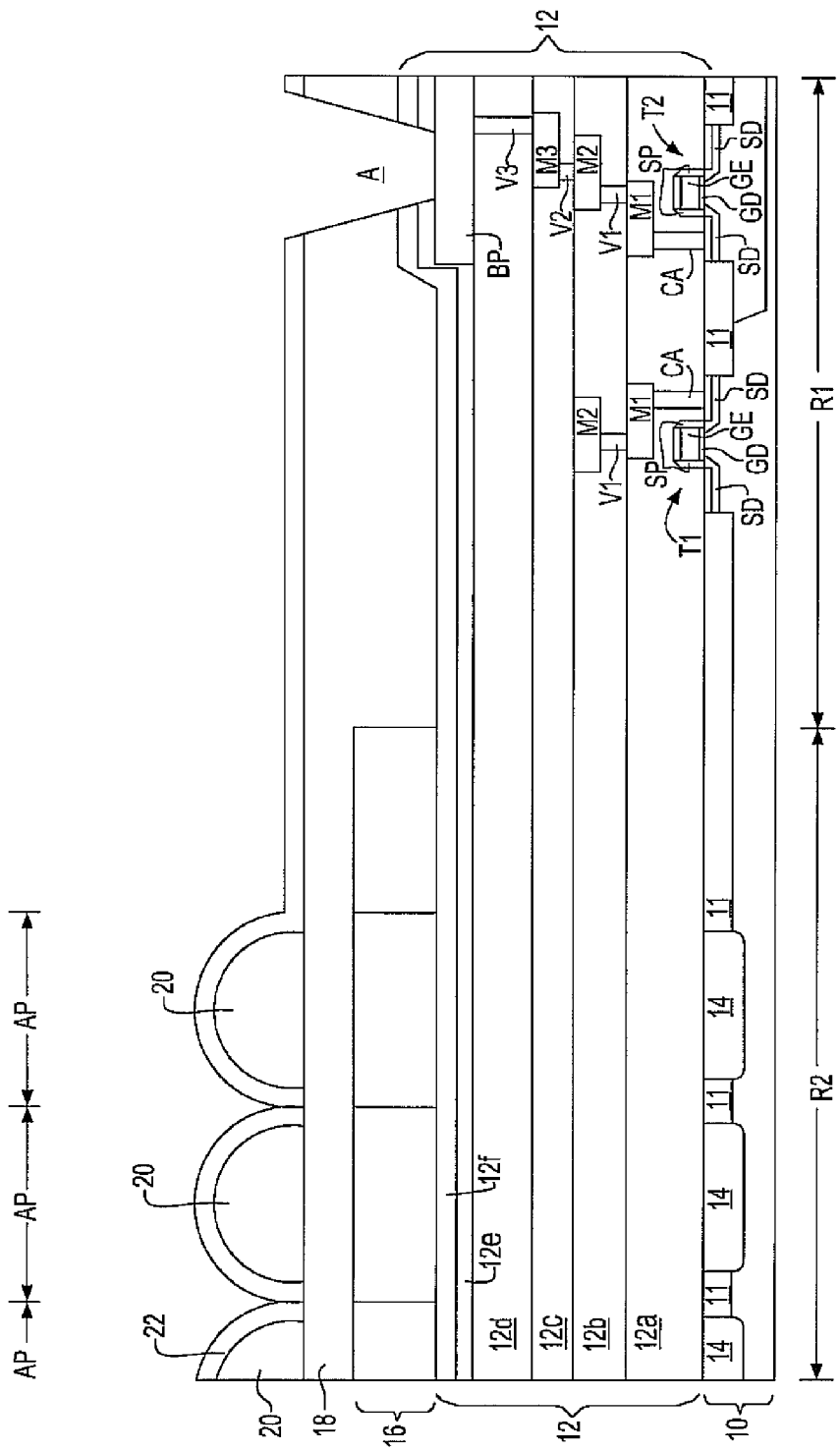
FIG. 1 shows a schematic cross-sectional diagram of an image sensor structure, which in accordance with modifications that are illustrated within the context of schematic cross-sectional diagrams that follow, provides a plurality of embodiments of an image sensor structure in accordance with the invention.

FIG. 1 shows a schematic cross-sectional diagram of an image sensor structure that provides a basis, in conjunction with further modification, for a particular plurality of embodiments of an image sensor structure in accordance with the invention. The particular plurality of image sensor structures is described in further detail below.

FIG. 1 shows a semiconductor substrate 10 that includes a circuitry portion R1 of the semiconductor substrate 10 that laterally adjoins and is adjacent a photosensitive portion R2 of the semiconductor substrate 10. Included within the photosensitive portion R2 of the semiconductor substrate 10 (as completely fabricated) is a plurality of active pixels AP. Although not illustrated with particularity, a dark pixel may also be included within the photosensitive portion R2 of the semiconductor substrate 10. The semiconductor substrate 10 also includes a plurality of isolation regions 11 that separates a plurality of active regions of the semiconductor substrate 10. Included within the active regions within the photosensitive portion R2 of the semiconductor substrate 10, and separated by the isolation regions 11, is a plurality of photosensitive regions 14. Included within the active regions within the circuitry portion R2 of the semiconductor substrate 10 is a plurality of transistors T1 and T2. Each of the plurality of transistors T1 and T2 includes a gate dielectric GD located and formed upon the semiconductor substrate 10, a gate electrode GE located and formed upon the gate dielectric GD, a spacer SP located and formed adjacent and adjoining the sidewalls of the gate dielectric GD and the gate electrode GE and a plurality of source and drain regions SD located and formed within the semiconductor substrate 10 and separated by the gate electrode GE. The plurality of transistors T1 and T2 is intended to include the transistors T1 and T2 that are of different polarity.

FIG. 1 also shows a dielectric isolated metallization stack 12 located and formed upon the semiconductor substrate 10. The dielectric isolated metallization stack 12 includes sequentially and successively laminated dielectric layers 12a, 12b, 12c, 12d, 12e and 12f. Also included within the dielectric isolated metallization stack 12 are conductor layers that include a plurality of contact vias CA, a plurality of first metal layers M1, a plurality of first vias V1, a plurality of second metal layers M2, a second via V2, a third metal layer M3, a third via V3 and a terminal metal layer intended as a bond pad BP.

FIG. 1 further also shows a color filter layer 16 that includes a plurality of color filter regions located and formed upon the dielectric isolated metallization stack 12 and covering the photosensitive region R2 of the semiconductor substrate. FIG. 1 also shows a planarizing layer 18 located and formed upon exposed portions of the color filter layer 16 and the dielectric isolated metallization stack 12. Individual color portions of the color filter layer 16 are located aligned with respect to individual active pixels AP (i.e., with individual photosensitive regions 14) within the plurality of active pixels AP. FIG. 1 also shows a plurality of active lens layers 20 located and formed over the corresponding color filter portions of the color filter layer 16 and also aligned with the photosensitive regions 14 within the active pixels AP. FIG. 1 also shows a lens capping layer 22 located and formed capping exposed portions of the active lens layers 20 and the planarizing layer 18. FIG. 1 finally shows an aperture A located and formed so as to expose the bond pad BP. The aperture is etched through the lens capping layer 22, the planarizing layer 18, the dielectric layer 12f and the dielectric layer 12e.

Each of the foregoing layers and structures that comprise the image sensor structure whose schematic cross-sectional diagram is illustrated in FIG. 1 may comprise materials, have dimensions and be formed using methods that are otherwise generally conventional in the optoelectronic fabrication art, and in particular the image sensor optoelectronic fabrication art.

For example, the semiconductor substrate 10 may comprise any of several semiconductor materials. Non-limiting examples include silicon, germanium, silicon-germanium alloy, silicon-carbon alloy, silicon-germanium-carbon alloy and compound semiconductor materials. Non-limiting examples of compound semiconductor materials include gallium-arsenide semiconductor materials, indium-arsenide semiconductor materials and indium-phosphide semiconductor materials. Typically the semiconductor substrate 10 comprises a silicon or silicon-germanium alloy semiconductor material that has a thickness from about 5 to about 100 microns.

The plurality of isolation regions 11 may include, but is not necessarily limited to, local oxidation of silicon (LOCOS) isolation regions, shallow trench isolation regions (i.e., having a depth up to about 5000 angstroms) and deep trench isolation regions (i.e., having a greater depth up to about 20 microns). Typically, the image sensor structure whose schematic cross-sectional diagram is illustrated in FIG. 1 uses shallow trench isolation regions that are located within shallow isolation trenches. The isolation regions 11 (whether located within shallow isolation trenches or deep isolation trenches) may comprise any of several dielectric materials. Typically included are oxides, nitrides and oxynitrides of silicon, as well as laminates thereof and composites thereof. Oxides, nitrides and oxynitrides of other elements are not excluded.

Typically, the plurality of isolation regions 11 is formed at least in part using a blanket layer deposition and planarizing method. Appropriate blanket layers may be formed using thermal or plasma oxidation or nitridation methods, chemical vapor deposition methods and physical vapor deposition methods. Planarization methods may include, but are not limited to mechanical planarizing methods, and chemical mechanical polish (CMP) planarizing methods. Chemical mechanical polish planarizing methods are most common.

Individual components of the transistors T1 and T2 are discussed in further detail immediately below. In general, those individual components may also include, but are not necessarily limited to, conventional materials formed to conventional dimensions using conventional methods.

The gate dielectrics GD may comprise any of several gate dielectric materials. Included but not limiting are generally lower dielectric constant gate dielectric materials such as but not limited to oxides, nitrides and oxynitrides of silicon having a dielectric constant from about 4 to about 20, measured in vacuum. Also included, and also not limiting, are generally higher dielectric constant gate dielectric materials having a dielectric constant from about 20 to at least about 100. These higher dielectric constant gate dielectric materials may include, but are not limited to hafnium oxides, hafnium silicates, titanium oxides, barium-strontium titanates (BSTs) and lead-zirconate titanates (PZTs).

The foregoing gate dielectric materials may be formed using methods appropriate to their materials of composition. Non-limiting examples of methods include thermal or plasma oxidation or nitridation methods, chemical vapor deposition methods (including atomic layer chemical vapor deposition methods) and physical vapor deposition methods. Typically, the gate dielectrics GD comprise a thermal silicon oxide gate dielectric material having a thickness from about 2 to about 7 nanometers.

The gate electrodes GE may similarly also comprise any of several gate electrode conductor materials. Non-limiting examples include certain metals, metal alloys, metal silicides and metal nitrides, as well as doped polysilicon materials (i.e., having a dopant concentration from about 1e18 to about 1e22 dopant atoms per cubic centimeter) and polycide (i.e., doped polysilicon/metal silicide stack) materials. The gate electrode materials may be deposited using any of several methods. Non-limiting examples include chemical vapor deposition methods (also including atomic layer chemical vapor deposition methods) and physical vapor deposition methods. Typically, each of the gate electrodes GE comprises a doped polysilicon material having a thickness from about 1000 to about 1500 angstroms.

The spacers SP are typically formed of a dielectric spacer material or a laminate of dielectric spacer materials, although spacer layers formed of conductor materials are also known. Oxides, nitrides and oxynitrides of silicon are commonly used as dielectric spacer materials.

Oxides, nitrides and oxynitrides of other elements are not excluded. The dielectric spacer materials may be deposited using methods analogous, equivalent or identical to the methods used for forming the gate dielectrics GD. Typically, the spacers SP are formed using a blanket layer deposition and etchback method that provides the spacers SP with the characteristic inward pointed shape.

Finally, the source and drain regions SD are typically formed using a two-step ion implantation method. The source and drain regions SD are implanted at a polarity (i.e., conductivity type) appropriate to a field effect transistor T1 or T2 within which they are formed. The two-step ion implantation method uses the gate electrode GE, or the spacer SP, as a mask. Typical concentrations of dopants within the source and drain regions SD is from about 1e15 to about 1e22 dopant atoms per cubic centimeter.

Similarly, while FIG. 1 illustrates an image sensor in accordance with the instant base structure as including generalized photosensitive regions 14, such generalized photosensitive regions 14 may more specifically include at least one of a photodiode or like photosensitive device (e.g., phototransistor) and a charge coupled device. Also, while FIG. 1 illustrates an image sensor that uses a semiconductor substrate 10 illustrated within the context of a bulk semiconductor substrate, the instant base structure is similarly also not so limited. Rather, the instant base structure may alternatively use a semiconductor-on-insulator substrate or a hybrid orientation substrate. A semiconductor-on-insulator substrate includes a buried dielectric layer located interposed between a base semiconductor substrate portion and a surface semiconductor layer portion of a semiconductor substrate. A hybrid orientation substrate includes multiple semiconductor regions of different crystallographic orientation.

The individual vias and interconnection layers CA, M1, V1, M2, V2, M3, V3 and BP that comprise the metallization components within the dielectric isolated metallization stack 12 may comprise any of several metallization materials that are conventional in the semiconductor fabrication art and the optoelectronic fabrication art. Non-limiting examples include certain metals, metal alloys, metal nitrides and metal silicides. Most common are tungsten metallization materials, aluminum metallization materials and copper metallization materials, any one of which often includes a barrier metallization material. Types of metallization materials may differ as a function of size and location within the image sensor structure whose schematic cross-sectional diagram is illustrated in FIG. 1. Smaller dimensioned and lower-lying metallization features (i.e., located nearer to the semiconductor substrate 10) other than the contact vias CA typically comprise copper containing conductor materials. Instead, the contact vias CA typically comprise tungsten containing conductor materials. Larger and upper-lying metallization features are more likely to comprise aluminum containing conductor materials.

The plurality of dielectric layers 12a, 12b, 12c, 12d, 12e and 12f within the dielectric isolated metallization stack 12 may comprise any of several dielectric materials that are conventional in the optoelectronic fabrication art. Included are generally higher dielectric constant dielectric materials having a dielectric constant from 4 to about 20. Non-limiting examples that are included within this group are oxides, nitrides and oxynitrides of silicon. As a preferred option, the plurality of dielectric layers 12a, 12b, 12c, 12d, 12e and 12f may also comprise generally lower dielectric constant dielectric materials having a dielectric constant from about 2 to about 4. Included but not limiting within this group are hydrogels, aerogels, silsesquioxane spin-on-glass dielectric materials, fluorinated glass materials and organic polymer materials.

Typically, the dielectric isolated metallization stack 12 comprises interconnected metallization layers and discrete metallization layers comprising at least one of copper metallization materials and aluminum metallization materials. Within the dielectric isolated metallization stack 12, at least one of the dielectric layers 12a, 12b, 12c, 12d, 12e and 12f comprises a generally lower dielectric constant dielectric material as is disclosed above. Typically, the dielectric isolated metallization stack 12 has an overall thickness from about 1 to about 4 micrometers. The dielectric isolated metallization stack 12 may typically comprise from about 2 to about 4 discrete horizontal dielectric and metallization subcomponent layers within the dielectric isolated metallization stack 12.

The color filter layer 16 will typically provide for some level of color discrimination within the limitations of the incoming radiation spectral range that is intended to be classified and imaged by the image sensor structure whose schematic cross-sectional diagram is illustrated in FIG. 1. Thus, individual color filter regions within the color filter layer 16 will include different types and different levels of appropriate dyes or pigments that provide appropriate color filter discrimination. The dyes or pigments may be dissolved in binders including but not limited to organic binders, inorganic binders and composites of organic binders and inorganic binders. Organic polymer binders, such as but not limited to organic polymer photoresist binders, are often common and desirable. Typically the color filter layer 16 has a thickness from about 200 to about 1000 nanometers.

The planarizing layer 18 may comprise any of several planarizing materials. Non-limiting examples of suitable planarizing materials include inorganic planarizing materials and organic planarizing materials. Inorganic planarizing materials may in particular include spin-on-glass planarizing materials. Organic planarizing materials may in particular include organic polymer planarizing materials such as but not limited to photoresist organic polymer planarizing materials. Typically, the planarizing layer 20 comprises a photoresist organic polymer planarizing material that has a thickness from about 100 to about 1000 nanometers.

The active lens layers 20 may comprise any of several optically transparent lens materials that are known in the optoelectronic fabrication art. Non-limiting examples include optically transparent inorganic materials, optically transparent organic materials and optically transparent composite materials. Most common are optically transparent organic materials. Typically the active lens layers 20 are formed incident to patterning and reflow of an organic polymer material that has a glass transition temperature lower than the color filter layer 16 and the planarizing layer 18. Other methods and materials may, however, be used for fabricating the active lens layers 20.

The lens capping layer 22 comprises a lens capping material that may further comprise an inorganic lens capping material, an organic lens capping material or a composite inorganic and organic lens capping material. Such materials may be deposited using methods that are generally conventional in the image sensor fabrication art, and that provide the lens capping layer 22 as a conformal layer. Such methods may include, but are not necessarily limited to, chemical vapor deposition methods and physical vapor deposition methods. Typically, the lens capping layer 22 comprises a silicon oxide lens capping material that has a thickness from about 50 to about 500 nanometers.

The image sensor structure whose schematic cross-sectional diagram is illustrated in FIG. 1 may be fabricated using a generally conventional processing scheme. In that regard, such processing typically begins with the semiconductor substrate 10 within and/or upon which are fabricated the isolation regions 11 and the transistors T1 and T2. The dielectric isolated metallization stack 12 is then successively laminated upon the semiconductor substrate 10 including the isolation regions 11 and the transistors T1 and T2. The color filter layer 16, a precursor to the planarizing layer 18, the active lens layers 20 and a precursor to the lens capping layer 22 are subsequently successively layered upon the dielectric isolated metallization stack 12 which includes precursor layers to the dielectric layers 12e and 12f. Finally, the lens capping layer 22, the precursor to the planarizing layer 18 and the precursors to the dielectric layers 12e and 12f are etched to form the aperture A that exposes the terminal metal bond pad BP.

As is understood by a person skilled in the art, due possibly in part to a dissimilarity in materials between the planarizing layer 18 and the lens capping layer 22, in conjunction with a comparatively large surface area of contact between the planarizing layer 18 and the lens capping layer 22, the lens capping layer 22 in the region horizontally interposed between the active lens layers 20 and the bond pad BP (i.e., the circuitry portion R2 of the semiconductor substrate 10) is subject to cracking and/or delamination from the planarizing layer 18. The subsequent several embodiments of the invention provide structural modifications to the image sensor structure whose schematic cross-sectional diagram is illustrated in FIG. 1 so that the lens capping layer 22 is less likely to crack, or delaminate from the planarizing layer 18 in the region horizontally interposed between the active lens layers 20 and the bond pad BP.

Figure 2:
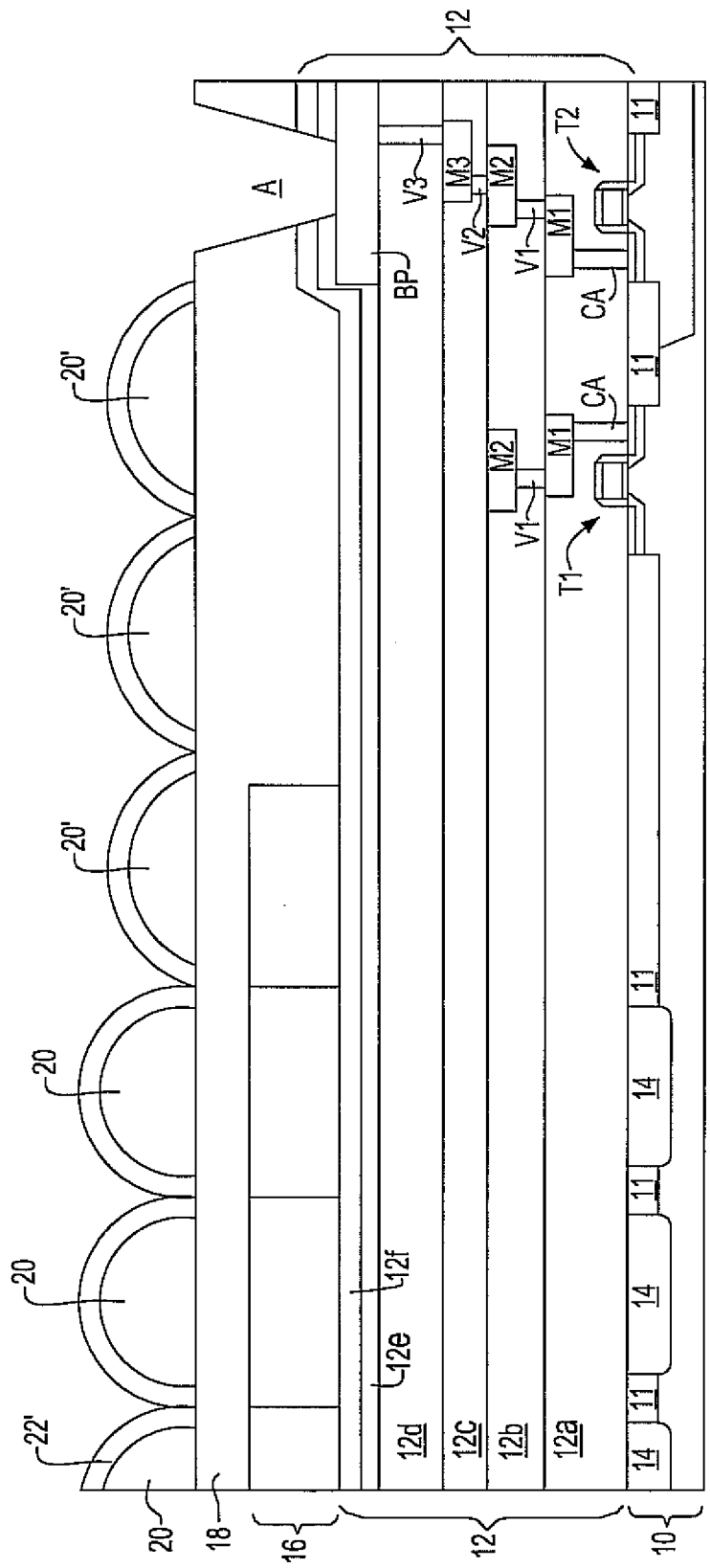
FIG. 2 shows a schematic cross-sectional diagram illustrating an image sensor structure in accordance with a particular embodiment of the invention.

FIG. 2 shows a schematic cross-sectional diagram of a first image sensor structure (i.e., a first embodiment) that results from a modification of the image sensor structure whose schematic cross-sectional diagram is illustrated in FIG. 1, in a fashion that provides for a reduced cracking of the lens capping layer 22 that is illustrated within the schematic cross-sectional diagram of FIG. 1, or delamination of the lens capping layer 22 that is illustrated within the schematic cross-sectional diagram of FIG. 1 from the planarizing layer 18 that is illustrated within the schematic cross-sectional diagram of FIG. 1.

To realize the foregoing object, this particular embodiment provides for locating and forming a plurality of dummy lens layers 20' upon the planarizing layer 18 at least in part in an area horizontally interposed between the active lens layers 20 and the bond pad BP (i.e., the circuitry region R2), prior to forming a lens capping layer 22' upon exposed portions of the active lens layers 20, the dummy lens layers 20' and the planarizing layer 18.

Within this particular embodiment, the dummy lens layers 20' are intended as being dimensioned differently than the active lens layers 20. In that regard, while the active lens layers 20 are intended to be dimensioned so that incoming light is properly and optimally focused upon the photosensitive regions 14, the dummy lens layers 20' are located and dimensioned so that any incoming light incident upon the dummy lens layers 20' does not enter the photosensitive regions 14. Within the context of the foregoing optical performance limitations, the active lens layers 20 typically have a circular bottom linewidth dimension from about 2 to about 10 nanometers and a height from about 30 to about 100 nanometers, while the dummy lens layers 20' typically have a circular bottom linewidth dimension from about 4 to about 20 nanometers and a height from about 30 to about 200 nanometers.

The active lens layers 20 and the dummy lens layers 20' may comprise the same or different lens materials. In accordance with disclosure above with respect to FIG. 1, the active lens layers 20 and the dummy lens layers 20' preferably generally comprise the same organic polymer lens material that may initially be patterned to different aerial dimensions and then reflowed to provide the different dimensionally sized active lens layers 20 and dummy lens layers 20'.

FIG. 2 shows a schematic cross-sectional diagram of an image sensor structure in accordance with a first embodiment of the invention. This particular image sensor structure provides an inhibited cracking of the lens capping layer 22' or delamination of the lens capping layer 22' from the planarizing layer 18 in a horizontal location interposed between a plurality of active lens layers 20 and a bond pad BP by including a plurality of dummy lens layers 20' interposed between the lens capping layer 22' and the planarizing layer 18 in the horizontal location interposed between the plurality of active lens layers 20 and the bond pad BP.

Figure 3A:
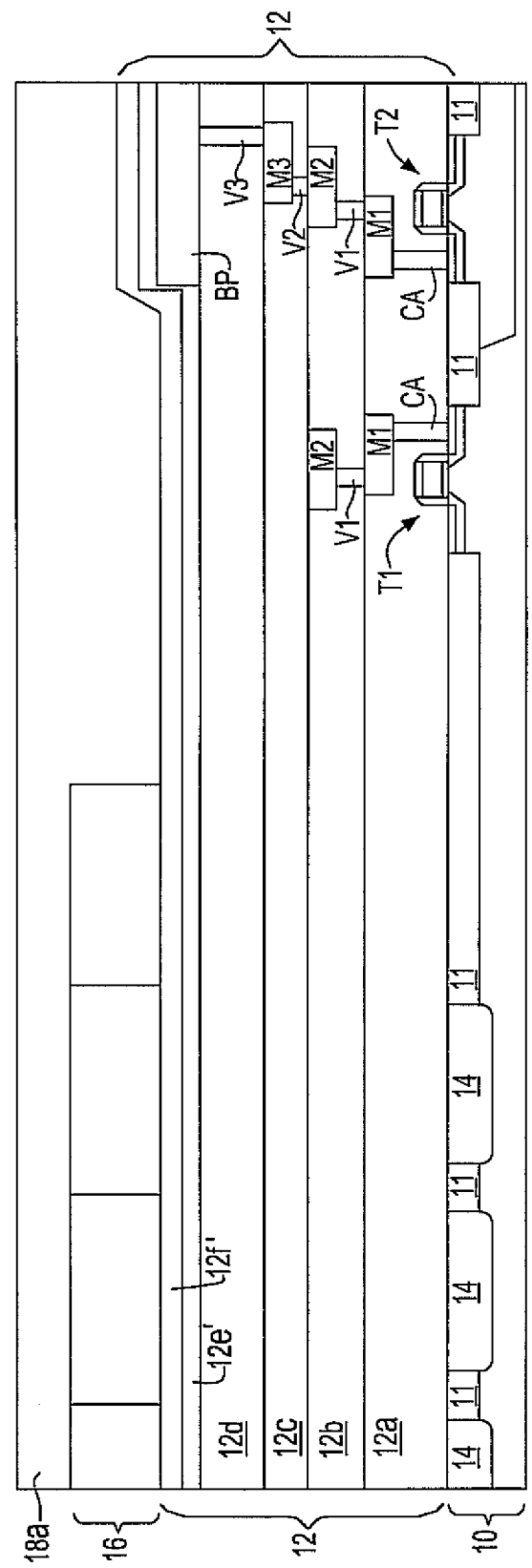
FIG. 3A to FIG. 3D show a series of schematic cross-sectional diagrams illustrating the results of progressive stages in fabricating an image sensor structure in accordance with another particular embodiment of the invention.

FIG. 3A to FIG. 3D shows a series of schematic cross-sectional diagrams illustrating the results of progressive stages in fabricating an image sensor structure in accordance with another particular embodiment of the invention. This other particular embodiment of the invention comprises a second embodiment of the invention. This other particular second embodiment of the invention also modifies the image sensor structure of FIG. 1 in a fashion that provides for a reduced cracking of the lens capping layer 22 that is illustrated in FIG. 1, or delamination of the lens capping layer 22 that is illustrated in FIG. 1 from the planarizing layer 18 that is illustrated in FIG. 1. FIG. 3A shows this particular image sensor structure at an early stage in the fabrication thereof in accordance with this particular other second embodiment of the invention.

FIG. 3A shows the image sensor structure whose schematic cross-sectional diagram is illustrated in FIG. 1, but fabricated only up to and including a planarizing layer 18a that serves as a precursor layer to the planarizing layer 18 that is illustrated in FIG. 1. Also illustrated in FIG. 3A is a dielectric layer 12f' that serves as a precursor layer to the dielectric layer 12f that is illustrated in FIG. 1 and a dielectric layer 12e' that serves as a precursor layer to the dielectric layer 12e that is illustrated in FIG. 1.

Figure 3B:
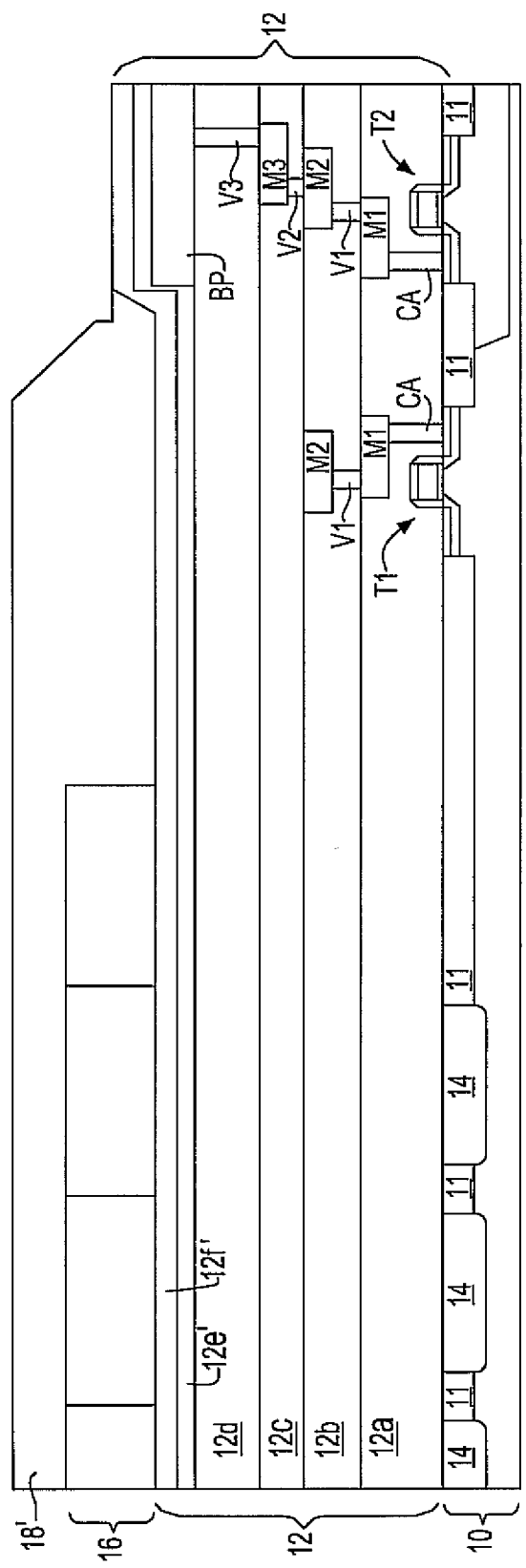

FIG. 3B shows a schematic cross-sectional that illustrates the results of etching the planarizing layer 18a to form a planarizing layer 18'. Such etching of the planarizing layer 18a to form the planarizing layer 18' may be effected using etch methods and etch material that are otherwise generally conventional in the semiconductor fabrication art. Included in particular, bur also not limiting, are masked etching methods that include wet chemical etch methods, dry plasma etch methods and combinations of wet chemical etch methods and dry plasma etch methods. As is illustrated within the schematic cross-sectional diagram of FIG. 3B, the foregoing etching of the planarizing layer 18a to form the planarizing layer 18' is intended to clear the planarizing layer material from over the bond pad BP and recess the planarizing layer material so that the planarizing layer material is also laterally recessed with respect to the bond pad BP.

Figure 3C:
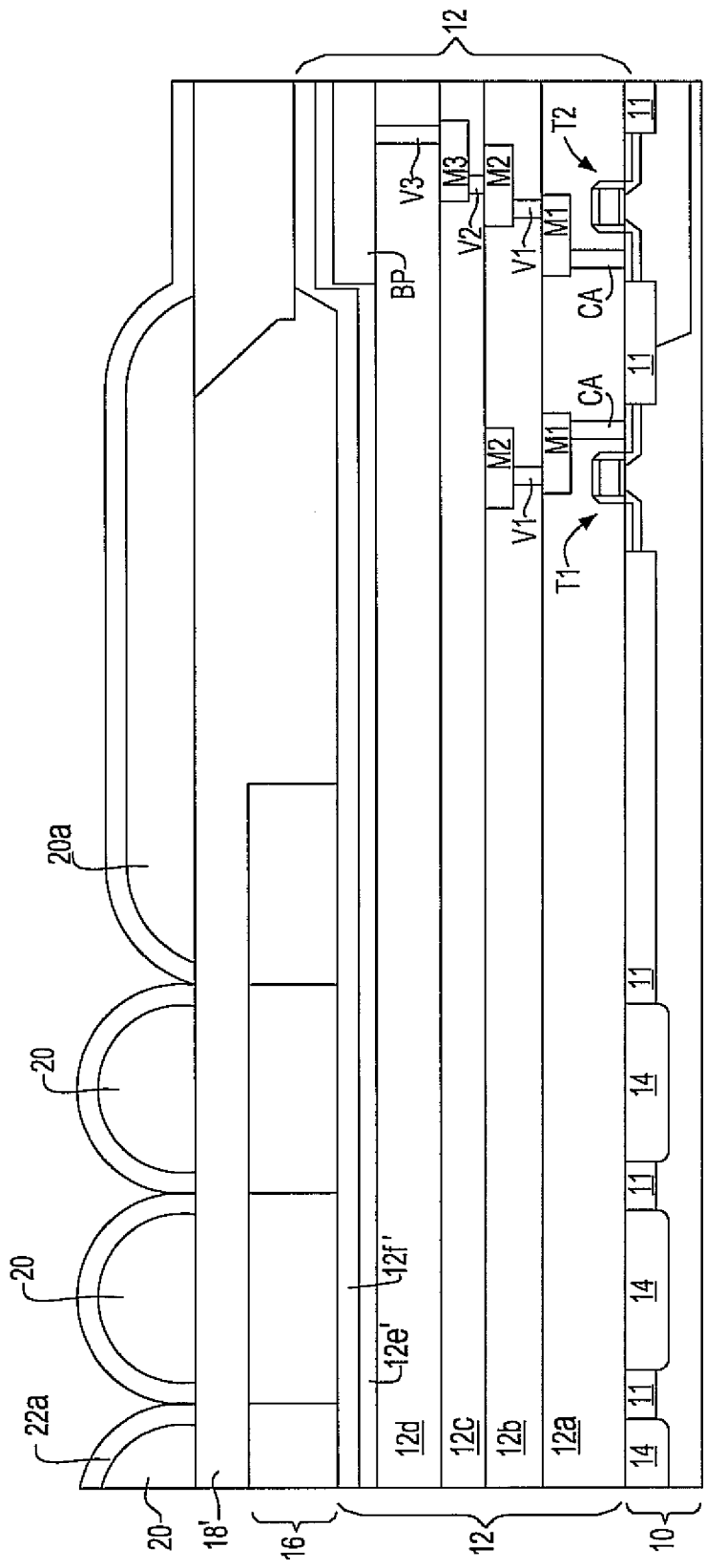

FIG. 3C shows the plurality of active lens layers 20, as well as a single enlarged dummy lens layer 20a, located and formed upon exposed portions of the planarizing layer 18' and the dielectric layer 12f'. As is illustrated within the schematic cross-sectional diagram of FIG. 3C, a lower portion of the enlarged dummy lens layer 20a is not coplanar, but rather below, a lower portion of the plurality of active lens layers 20. FIG. 3C also shows a lens capping layer 22a located and formed upon exposed portions of the active lens layers 20, the enlarged dummy lens layer 20a and the planarizing layer 18'.

Figure 3D:
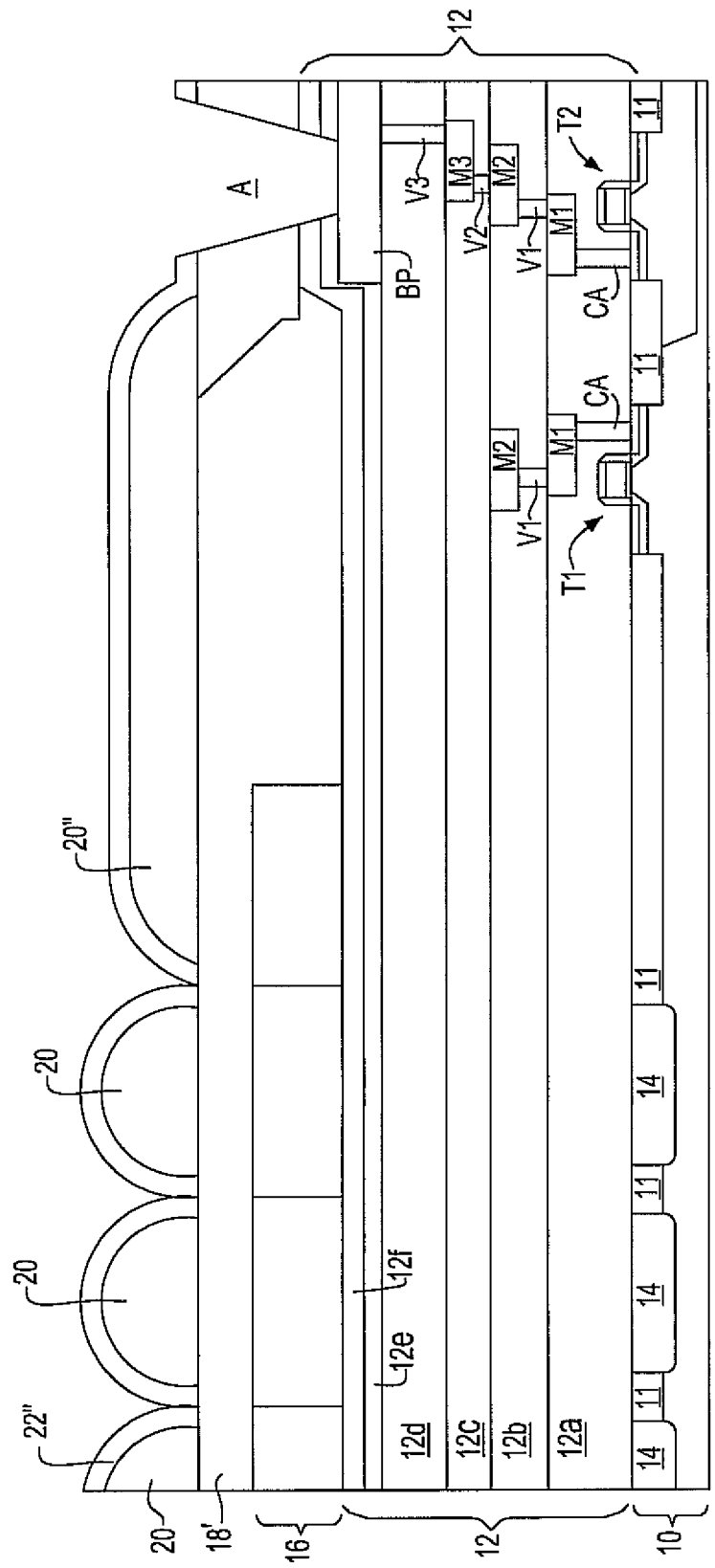

FIG. 3D shows a lens capping layer 22", an enlarged dummy lens layer 20", the dielectric layer 12f and the dielectric layer 12e that result from patterning the lens capping layer 22a, the enlarged dummy lens layer 20a, the dielectric layer 12f' and the dielectric layer 12e' that are illustrated in FIG. 3C. The foregoing patterning may be effected using methods and materials that are otherwise generally conventional in the image sensor structure fabrication art. Included in particular are wet chemical etching methods, dry plasma etching methods and combinations of wet chemical etching methods and dry plasma etching methods.

FIG. 3D shows a schematic cross-sectional diagram of an image sensor structure in accordance with a second embodiment of the invention. The image sensor structure provides for inhibited cracking of a lens capping layer 22" or delamination of the lens capping layer 22" with respect to a planarizing layer 18' by incorporation of an enlarged dummy lens layer 20" interposed between the lens capping layer 22" and the planarizing layer 18' at a location horizontally interposed between the plurality of active lens layers 20 and the bond pad BP.

Figure 4A:
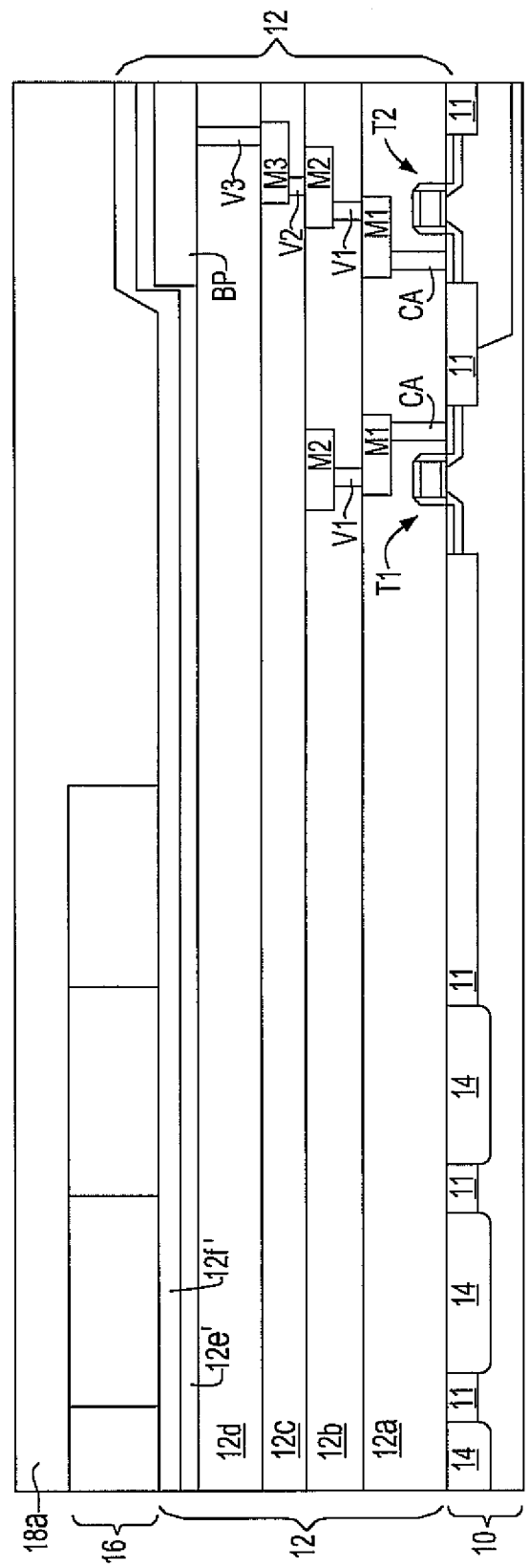
FIG. 4A to FIG. 4C show a series of schematic cross-sectional diagrams illustrating the results of progressive stages in fabricating an image sensor structure in accordance with yet another particular embodiment of the invention.
Figure 4B:
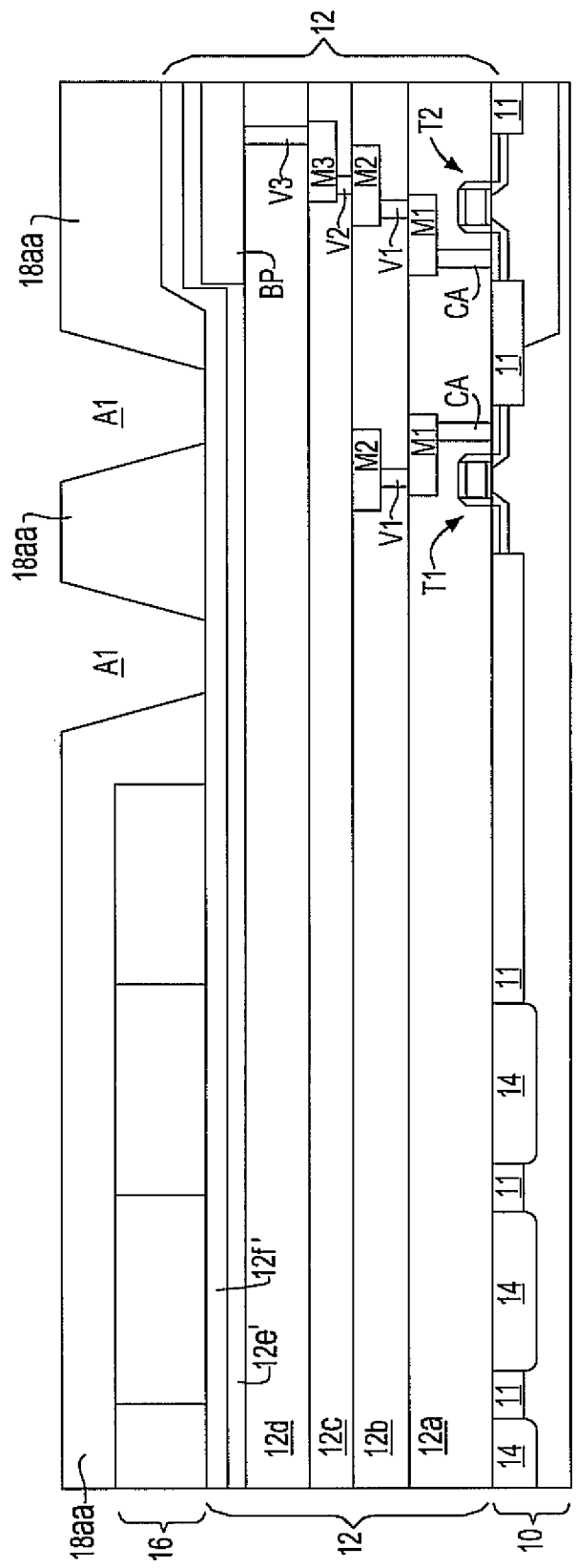
Figure 4C:
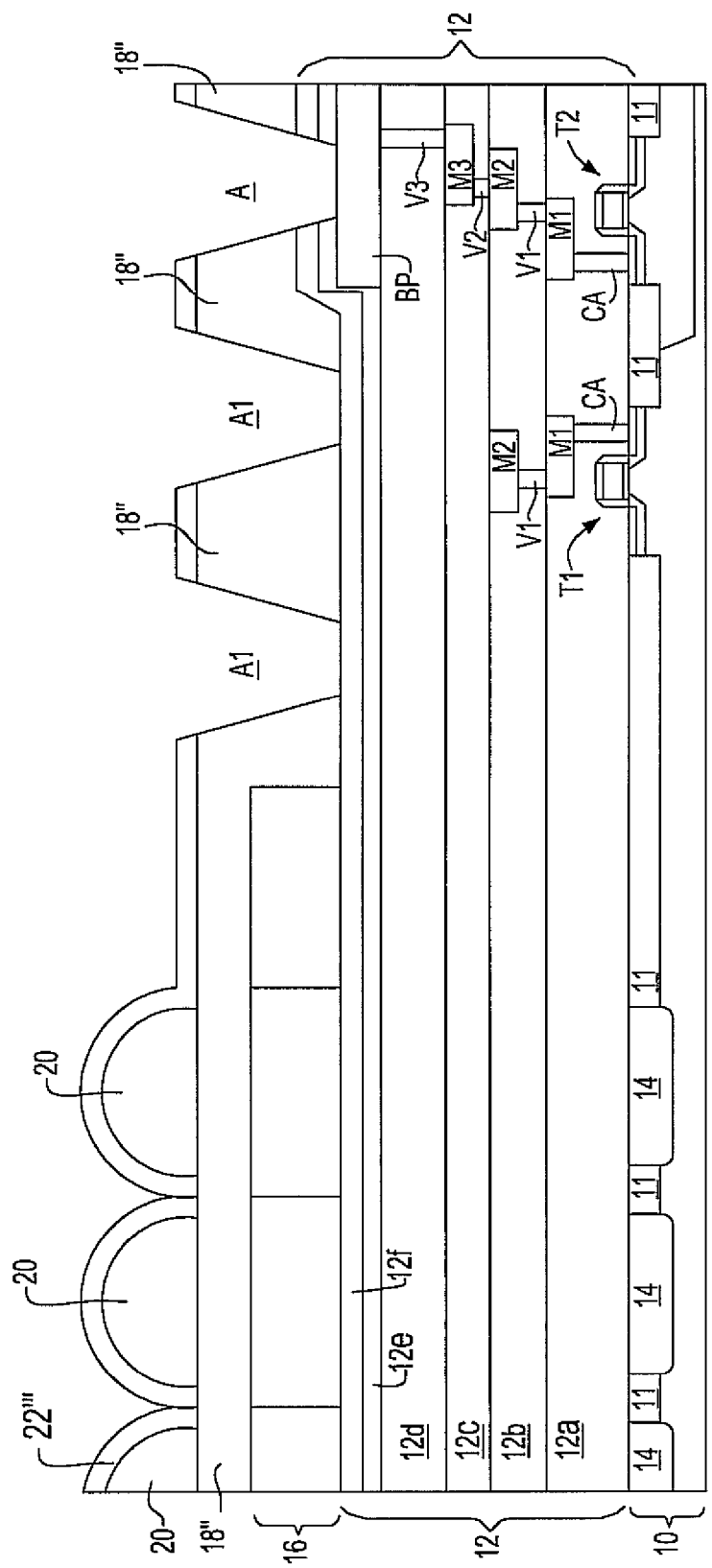

FIG. 4A to FIG. 4C show a series of schematic cross-sectional diagrams illustrating the results of progressive stages in fabricating an image sensor structure in accordance with yet another embodiment of the invention. This other particular embodiment of the invention comprises a third embodiment of the invention. FIG. 4A shows a schematic cross-sectional diagram of the image sensor structure at an early stage in the fabrication thereof in accordance with this particular other third embodiment.

FIG. 4A shows a schematic cross-sectional diagram of an image sensor structure in accordance with the image sensor structure whose schematic cross-sectional diagram is illustrated in FIG. 3A, which in particular illustrates an image sensor structure fabricated up to and including the planarizing layer 18a as an exposed surface layer.

FIG. 4B shows a planarizing layer 18aa that results from etching the planarizing layer 18a that is illustrated in FIG. 4A. Etching of the planarizing layer 18a that is illustrated in FIG. 4A to form the planarizing layer 18aa that is illustrated in FIG. 4B may be effected using etch methods and etch materials that are otherwise generally conventional in the image sensor fabrication art. Included in particular are masked etch methods that may use etchants including but not limited to wet chemical etchants, dry plasma etchants and combinations of wet chemical etchants and dry plasma etchants.

As is illustrated within the schematic cross-sectional diagram of FIG. 4B, the planarizing layer 18aa includes a plurality of apertures A1 interposed between the color filter layer 16 and the bond pad BP. Such apertures A1 typically have a linewidth dimension from about 20 to about 100 nanometers, and such apertures A1 need not necessarily penetrate completely through the planarizing layer 18aa.

FIG. 4C shows an image sensor structure that results from further processing of the image sensor structure whose schematic cross-sectional diagram is illustrated in FIG. 4B. FIG. 4C shows the results of forming the active lens layers 20 upon the left hand horizontal portion of the image sensor structure whose schematic cross-sectional diagram is illustrated in FIG. 4B. FIG. 4C next shows a lens capping layer 22''' located and formed upon exposed portions of the active lens layers 20, a planarizing layer 18'' that results from further patterning of the planarizing layer 18aa and the dielectric isolated metallization stack 12. FIG. 4C finally shows the aperture A that is etched through the lens capping layer 22''', the planarizing layer 18'', the dielectric layer 12f and the dielectric layer 12e, to expose the bond pad BP.

FIG. 4C shows a schematic cross-sectional diagram of an image sensor structure in accordance with a third embodiment of the invention. The image sensor structure includes a planarizing layer 18'' that has a topographic pattern, and in particular a plurality of apertures A1, located and formed therein interposed between a plurality of active lens layers 20 and a bond pad BP. By virtue of the presence of the topographic pattern that includes the plurality of apertures A1, the lens capping layer 22''' located and formed upon the planarizing layer 18'' and further located interposed between the plurality of active lens layers 20 and the bond pad BP is less susceptible to cracking, or delamination from the planarizing layer 18''.

Figure 5A:
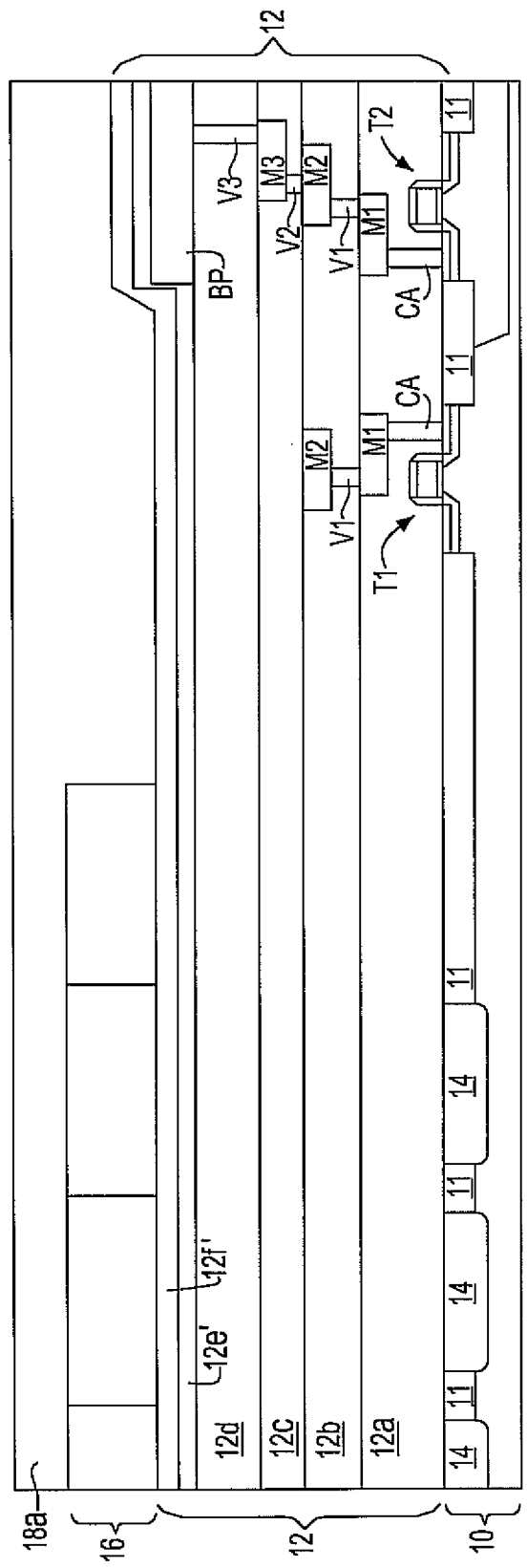
FIG. 5A to FIG. 5C show a series of schematic cross-sectional diagrams illustrating the results of progressive stages in fabricating an image sensor structure in accordance with still yet another particular embodiment of the invention.
Figure 5B:
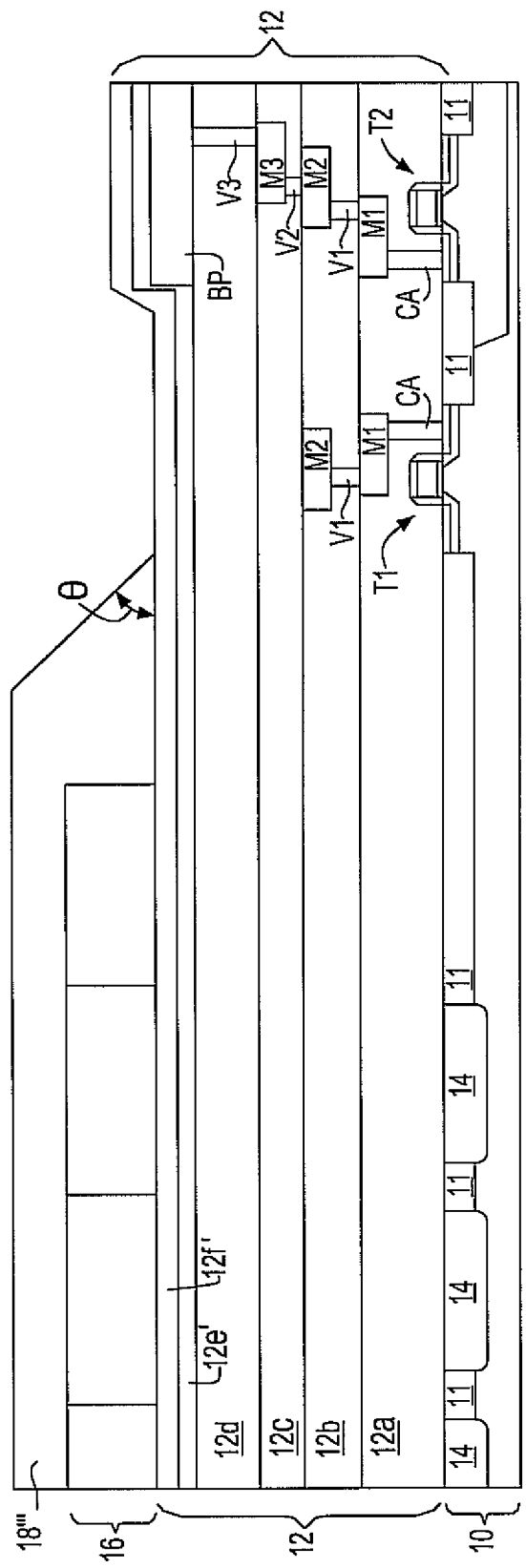
Figure 5C:
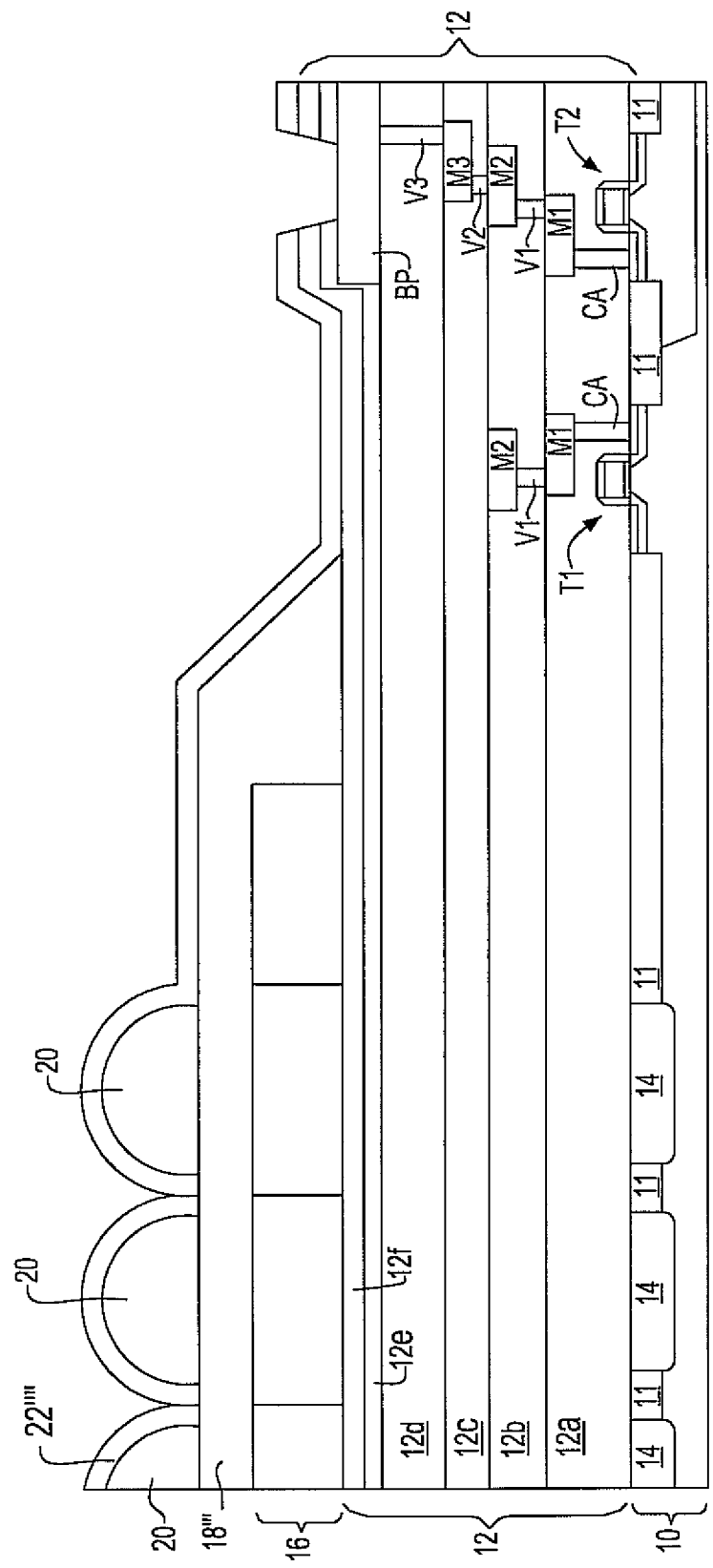

FIG. 5A to FIG. 5C show a series of schematic cross-sectional diagrams illustrating the results of progressive stages in fabricating an image sensor structure in accordance with still yet another embodiment of the invention. This particular other embodiment of the invention comprises a fourth and final embodiment of the invention. FIG. 5A shows a schematic cross-sectional diagram of the image sensor structure at an early stage in the fabrication thereof in accordance with this particular fourth and final embodiment of the invention.

FIG. 5A corresponds identically with FIG. 4A and FIG. 3A, with like or identical features being designated with like or identical reference numerals. As is similarly illustrated within the schematic cross-sectional diagrams of FIG. 4A and FIG. 3A, the image sensor structure whose schematic cross-sectional diagram is illustrated in FIG. 5A includes as a surface layer the planarizing layer 18a.

FIG. 5B shows the results of etching the planarizing layer 18a that is illustrated in FIG. 5A to form a planarizing layer 18''' that has a sloped sidewall (i.e. endwall) interposed between the color filter layer 16 and the bond pad BP (i.e., within the circuitry region R2). Typically the slope includes an angle $\Theta$ from about 30 to about 80 degrees with respect to a horizontal surface or interface within the image sensor structure whose schematic cross-sectional diagram is illustrated in FIG. 5B.

FIG. 5C shows the results of further processing of the image sensor structure whose schematic cross-sectional diagram is illustrated in FIG. 5B. FIG. 5C first shows a lens capping layer 22'''' located and formed upon exposed portions of the plurality of active lens layers 20, the planarizing layer 18''' and the dielectric isolated metallization stack 12. FIG. 5C finally shows the results of etching through the lens capping layer 22''', the dielectric layer 12f and the dielectric layer 12e to expose the bond pad BP.

FIG. 5C shows a schematic cross-sectional diagram of an image sensor structure in accordance with a fourth and final embodiment of the invention. This particular fourth and final embodiment uses a sloped sidewall of the planarizing layer 18''' located and formed interposed between the active lens layers 20 and the bond pad BP (i.e., not encroaching over or upon the bond pad BP) as a means and mechanism for inhibiting cracking of the lens capping layer 22'''' or delamination of the lens capping layer 22''' with respect to the planarizing layer 18'''.

The foregoing four embodiments of the invention are illustrative of the invention rather than limiting of the invention. Revisions and modifications may be made to methods, materials, structures and dimensions of an image sensor structure in accordance with the foregoing four preferred embodiments, while still providing an image sensor structure in accordance with the invention, further in accordance with the accompanying claims.

What is claimed is:

1. A method for fabricating an image sensor structure comprising:
   providing a substrate including a photosensitive portion and a circuitry portion;
   forming a dielectric isolated metallization stack located upon the substrate;
   forming a planarizing layer over the dielectric isolated metallization stack;
   forming a plurality of active lens layers located over the planarizing layer and registered with a plurality of photosensitive regions within the photosensitive portion, and forming at least one dummy lens layer of different dimensions at least in part over the planarizing layer and over the circuitry portion; and
   forming a lens capping layer passivating exposed portions of the plurality of active lens layers, the at least one dummy lens layer and the planarizing layer.

2. The method of claim 1 further comprising forming a color filter layer over the dielectric isolated metallization stack prior to forming the planarizing layer over the dielectric isolated metallization stack, a plurality of color filter regions within the color filter layer also being registered with respect to the plurality of photosensitive regions.

3. The method of claim 1 wherein the forming the at least one dummy lens layer provides the at least one dummy lens layer with a different lens shape in comparison with the plurality of active lens layers.

4. The method of claim 1 wherein the forming the at least one dummy lens layer provides that the at least one dummy lens layer is coplanar at a bottom with the bottoms of the plurality of active lens layers.

5. The method of claim 1 wherein the forming the at least one dummy lens layer provides that the at least one dummy lens layer is not completely coplanar at a bottom with the bottoms of the plurality of active lens layers.

6. A method for fabricating an image sensor structure comprising:
- providing a substrate including a photosensitive portion and a circuitry portion, wherein the circuitry portion includes a bonding pad;
- forming a dielectric isolated metallization stack upon the substrate;
- forming a planarizing layer over the dielectric isolated metallization stack, wherein the planarizing layer has a sloped endwall so that the planarizing layer does not extend over the bonding pad;
- forming a plurality of active lens layers over the planarizing layer and registered with a plurality of photosensitive regions within the photosensitive portion;
- forming a lens capping layer passivating exposed portions of the plurality of active lens layers and the planarizing layer.

7. The method of claim 6 further comprising forming a color filter layer over the substrate after forming the dielectric isolated metallization stack over the substrate and prior to forming the planarizing layer over the substrate, a plurality of color filter regions within the color filter layer also being registered with respect to the plurality of photosensitive regions.

8. The method of claim 6 wherein the planarizing layer includes at least two apertures formed over the circuitry portion.

9. The method of claim 6, wherein by separating the planarizing layer from the bonding pad with the sloped endwall, the method reduces cracking and delamination of the image sensor structure when compared to image sensors having a planarization layer that extends over a bonding pad.

10. The method of claim 6, wherein the bonding pad is present overlying one or more transistors, wherein the bonding pad is in electrical communication with at least one of the one or more transistors.

11. The method of claim 6, wherein the sloped endwall forms an angle ranging from between 30 degrees and 80 degrees with respect to a horizontal surface.

* * * * *